US010395816B2

(12) United States Patent
Mo et al.

(10) Patent No.: US 10,395,816 B2
(45) Date of Patent: Aug. 27, 2019

(54) MAGNETIC DEVICE FABRICATION METHOD

(71) Applicant: AJOHO ENTERPRISE CO., LTD., Taipei (TW)

(72) Inventors: Chia-Ping Mo, Taipei (TW); You-Chi Liu, Taipei (TW)

(73) Assignee: Ajoho Enterprise Co., Ltd., Taipei (TW)

( * ) Notice: Subject to any disclaimer, the term of this patent is extended or adjusted under 35 U.S.C. 154(b) by 104 days.

(21) Appl. No.: 15/803,474

(22) Filed: Nov. 3, 2017

(65) Prior Publication Data

US 2019/0139694 A1 May 9, 2019

(51) Int. Cl.

*H01F 7/06* (2006.01)
*H01F 27/29* (2006.01)
*H05K 3/00* (2006.01)
*H01F 41/04* (2006.01)
*H01F 17/00* (2006.01)
*H01F 27/28* (2006.01)
*H05K 1/02* (2006.01)
*H01F 27/24* (2006.01)
*H01F 17/06* (2006.01)
*B29C 33/16* (2006.01)

(52) U.S. Cl.

CPC ........... *H01F 27/292* (2013.01); *B29C 33/16* (2013.01); *H01F 17/0013* (2013.01); *H01F 17/06* (2013.01); *H01F 27/24* (2013.01); *H01F 27/2804* (2013.01); *H01F 41/043* (2013.01); *H01F 41/046* (2013.01); *H05K 1/0233* (2013.01); *H05K 3/007* (2013.01); *H01F 2017/0066* (2013.01); *H01F 2027/2819* (2013.01); *H05K 2201/086* (2013.01)

(58) Field of Classification Search

CPC ..... B29C 33/16; H01F 17/0013; H01F 17/06; H01F 27/24; H01F 27/2804; H01F 27/292; H01F 41/043; H01F 41/046; H01K 1/0233; H05K 3/007

See application file for complete search history.

(56) References Cited

U.S. PATENT DOCUMENTS 5,191,699 A * 3/1993 Ganslmeier ......... H01F 17/0033 264/272.19
5,959,846 A * 9/1999 Noguchi ............. H01F 17/0033 257/690
2012/0194314 A1* 8/2012 Mo ........................ H05K 1/165 336/200

FOREIGN PATENT DOCUMENTS

JP 2009218530 A * 9/2009

* cited by examiner

*Primary Examiner* — Paul D Kim

(74) *Attorney, Agent, or Firm* — Muncy, Geissler, Olds & Lowe, P.C.

(57) ABSTRACT

A magnetic device fabrication method includes the step of using molds to respectively process a first substrate and a second substrate into respective predetermined shapes, the step of forming conductors in shaped protruding blocks of the first substrate and conducting contacts in the second substrate, the step of attaching one or more magnetic cores to the first plate member to couple one or more positioning slots to the protruding blocks of the first plate member respectively and the step of bonding one or multiple magnetic cores between the first and second substrate to provide a continuous winding type induction coil effect, saving much manufacturing labor and time.

7 Claims, 18 Drawing Sheets

MAGNETIC DEVICE FABRICATION METHOD

BACKGROUND OF THE INVENTION

1. Field of the Invention

The present invention relates to magnetic technologies and more particularly, to such an inexpensive magnetic device fabrication method, which uses molds to respectively process a first substrate and a second substrate into respective predetermined shapes, and then forms conductors in shaped protruding blocks of the first substrate and conducting contacts in the second substrate, and then bond one or multiple magnetic cores between the first and second substrate to provide a continuous winding type induction coil effect, saving much manufacturing labor and time.

2. Description of the Related Art

Conventional transformers, inductors or magnetic induction components commonly comprise an iron core, two enameled wires wound round the iron cores with the four lead ends thereof respectively extended to two flanges of the iron core for connection to an external circuit for converting voltage and current and for removing magnetic waves through a grounding terminal. It takes much labor and time to wind the two enameled wires round the iron core, increasing the cost. Further, a transformer, inductor or magnetic induction component made in this manner has a large size that requires much installation space. This design does not meet the concept of the modern electronic product designs with light, thin, short, small characteristics. When multiple transformers are used in an electronic product, the electric wiring will be complicated. Therefore, there is a strong demand for improvement in the fabrication of transformers.

SUMMARY OF THE INVENTION

The present invention has been accomplished under the circumstances in view. It is therefore the main object of the present invention to provide a magnetic device fabrication method, which facilitates quick production, saving much manufacturing labor and time.

To achieve this and other objects of the present invention, a magnetic device fabrication method includes the step of using a mold to process an electrically insulative first substrate into a first plate member with a plurality of protruding blocks and forming a plurality of conductors in each protruding block, the step of using a mold to process an electrically insulative second substrate into a second plate member and then forming a plurality of conducting contact in the second plate member in rows, the step of using a mold to process a magnetic material into at least one magnetic core each having at least one positioning slot cut through opposing top and bottom surface thereof, the step of attaching the at least one magnetic core to the first plate member to couple the at least one positioning slot to the protruding blocks and then attaching the second plate member to the at least one magnetic core and the protruding blocks for enabling the conducting contacts to be respectively kept in contact with the respective conductors.

Preferably, the first substrate and the second substrate prepared are one-piece members selected from the material group of electrically insulative plastics, silicon rubber and ceramics. Further, the conductors are formed in the protruding blocks of the first substrate by welding, electroplating, conducting adhesive filling, circuit printing or conductor press-fitting, and at least one input terminal and at least one output terminal are also formed at the same time on the first plate member opposite to the protruding blocks.

Other advantages and features of the present invention will be fully understood by reference to the following specification in conjunction with the accompanying drawings, in which like reference signs denote like components of structure.

DETAILED DESCRIPTION OF THE PREFERRED EMBODIMENT

Figure 1:
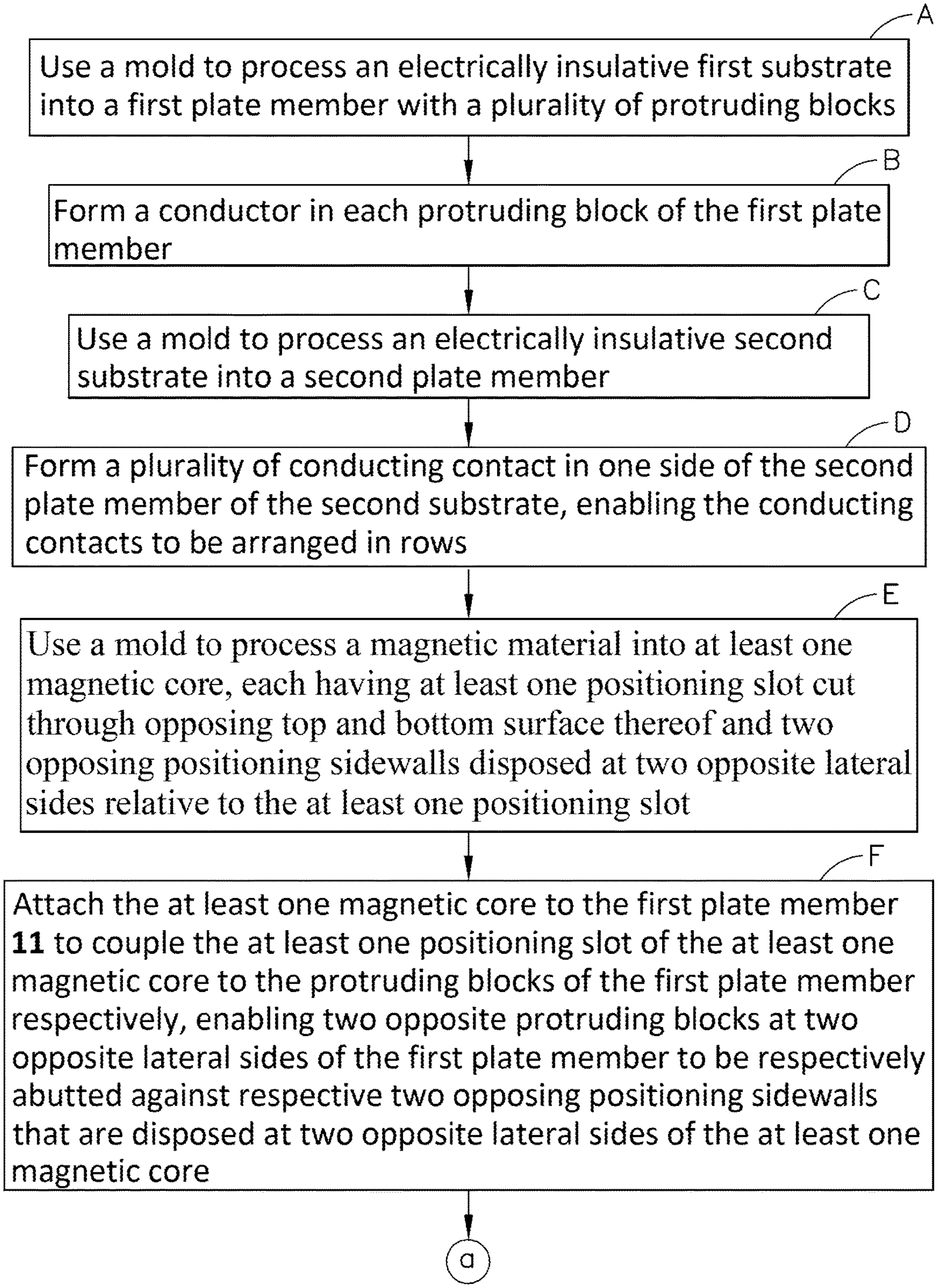
FIG. 1 is a magnetic device fabrication flow chart (I) in accordance with the present invention.
Figure 2:
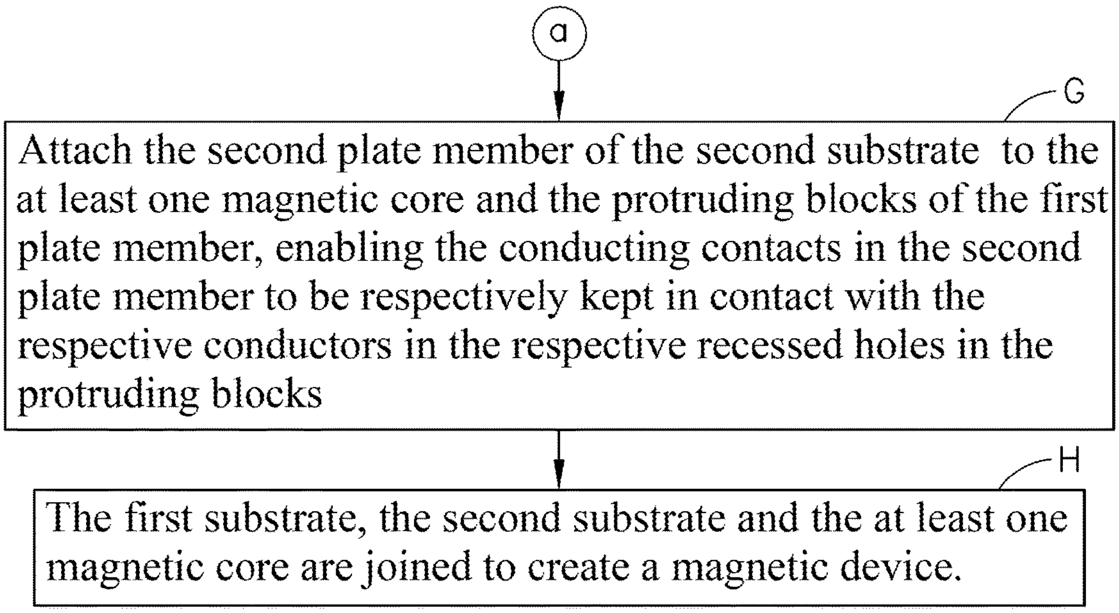
FIG. 2 is a magnetic device fabrication flow chart (II) in accordance with the present invention.
Figure 3:
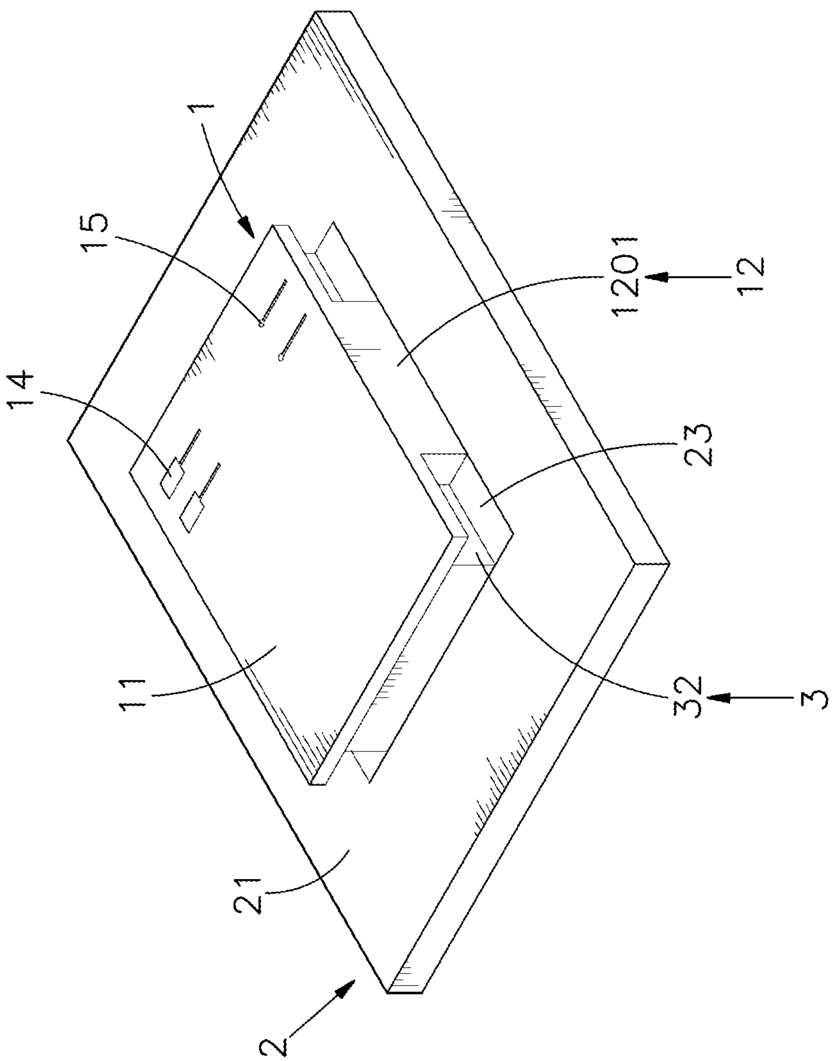
FIG. 3 is an oblique top elevational view of a magnetic device made in accordance with the present invention.
Figure 4:
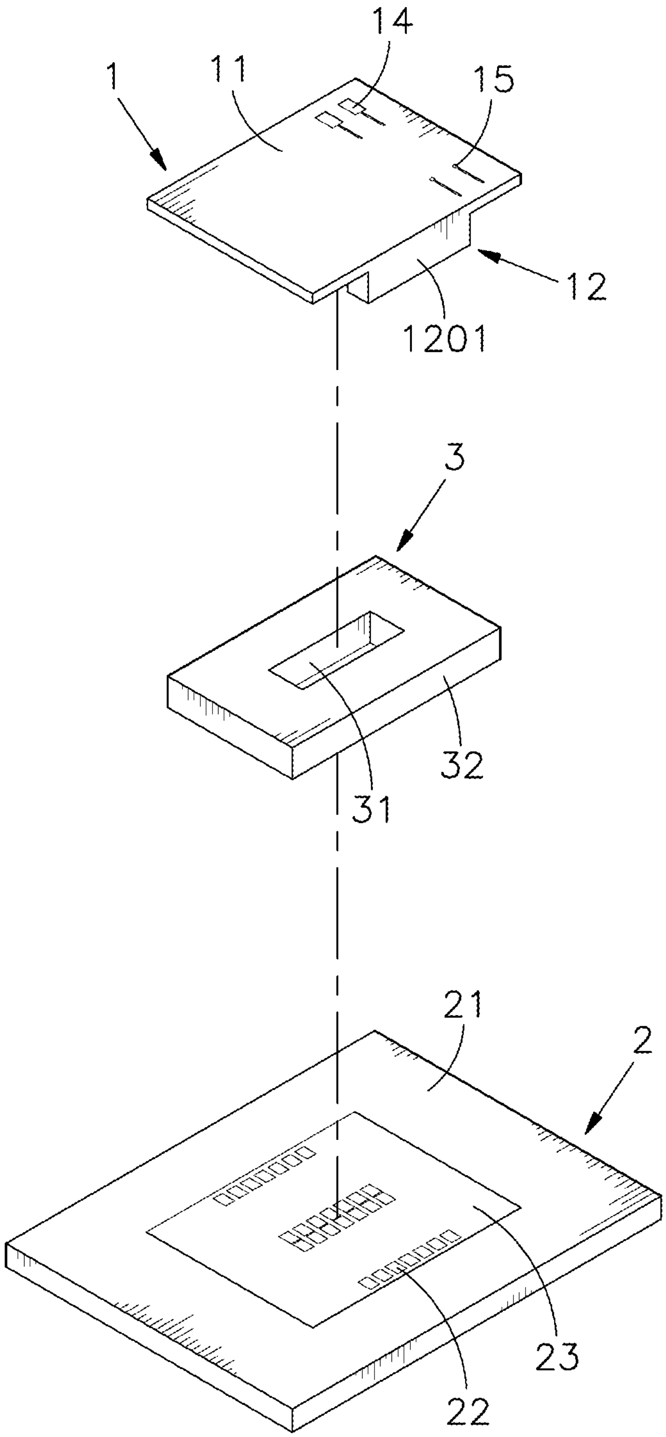
FIG. 4 is an exploded view of the magnetic device shown in FIG. 3.
Figure 5:
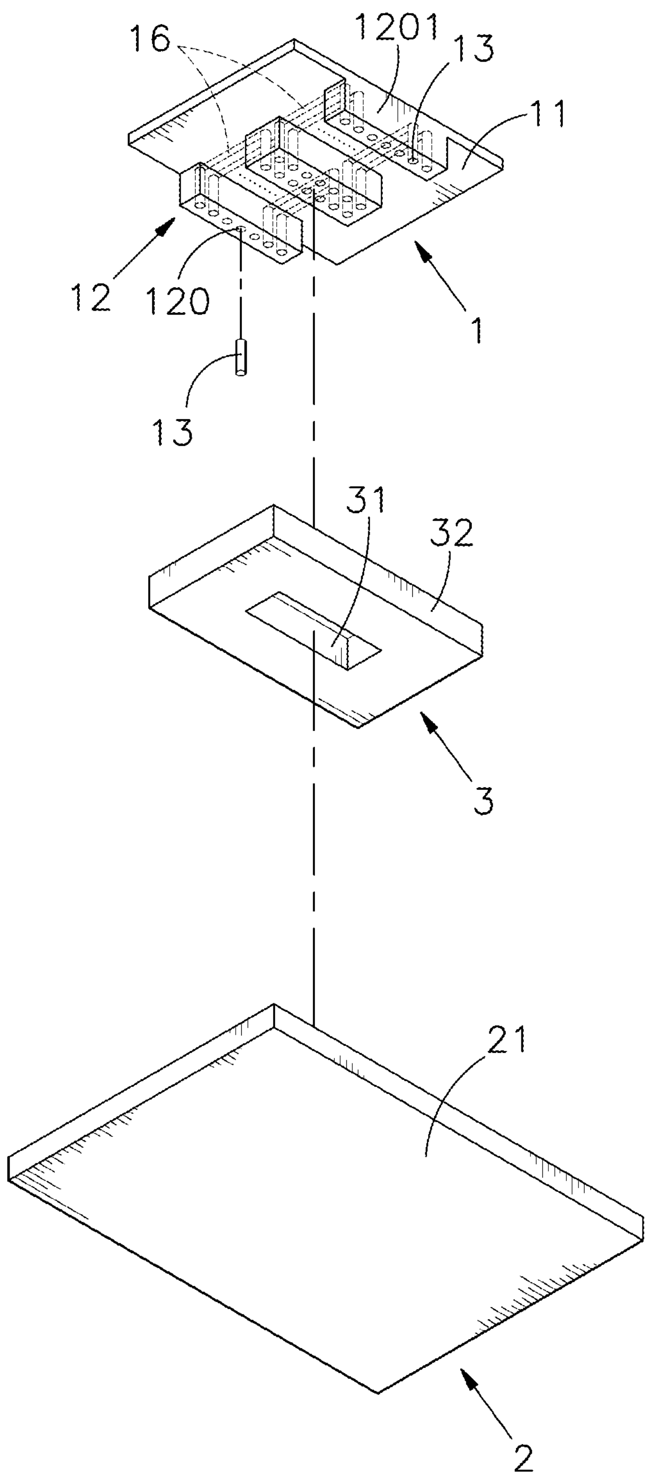
FIG. 5 corresponds to FIG. 4 when viewed from another angle.
Figure 6:
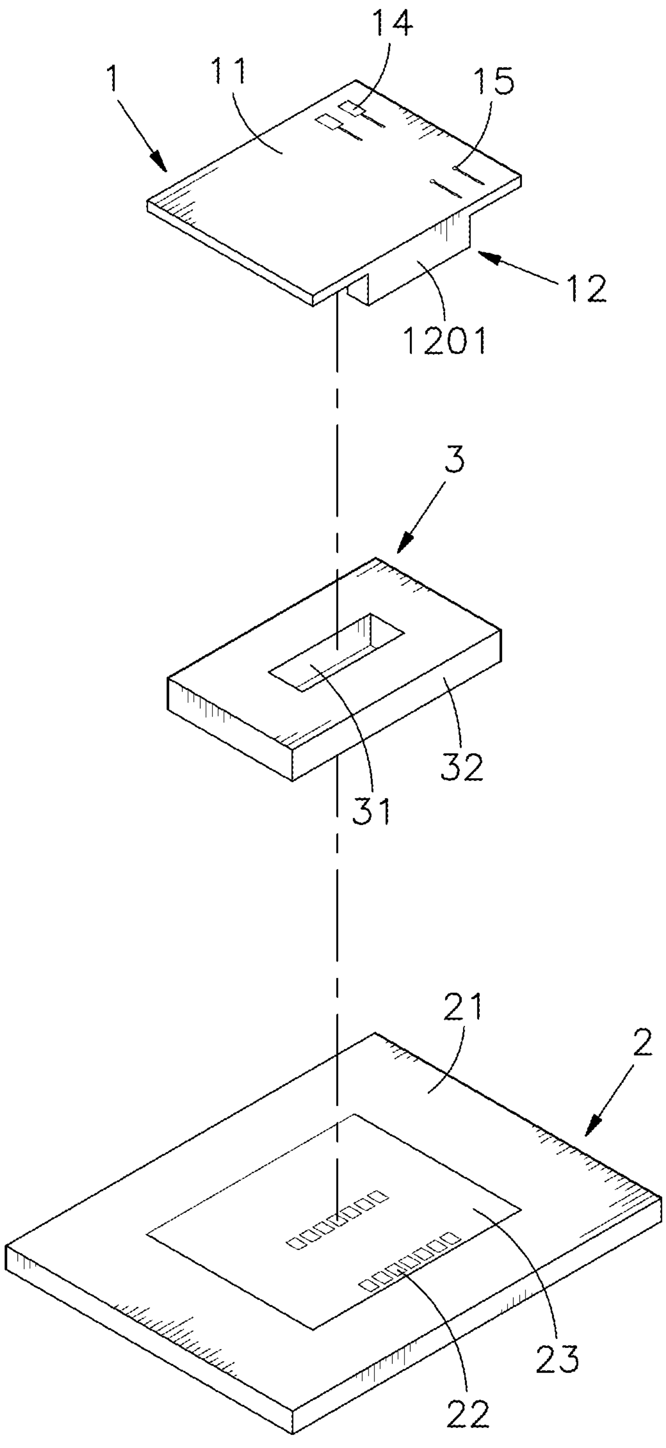
FIG. 6 is an exploded view of an alternate form of the magnetic device made in accordance with the present invention.
Figure 7:
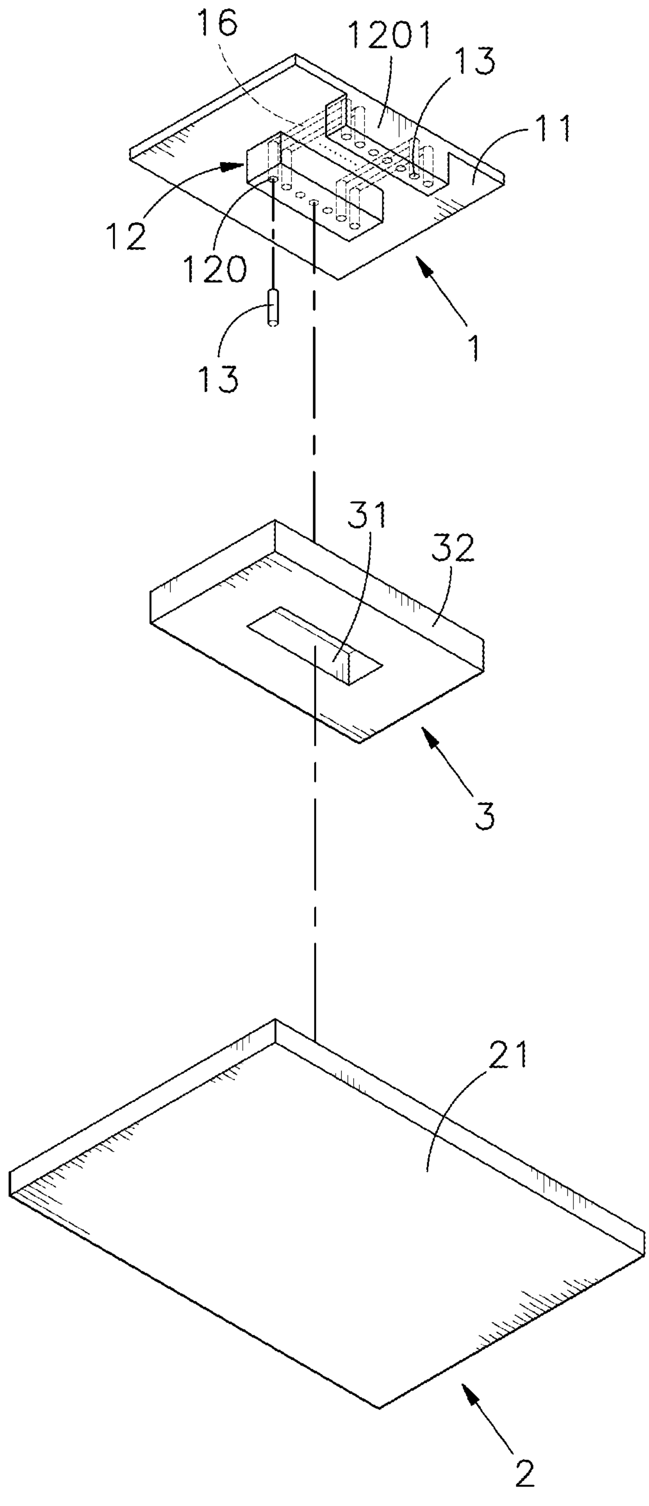
FIG. 7 corresponds to FIG. 6 when viewed from another angle.
Figure 8:
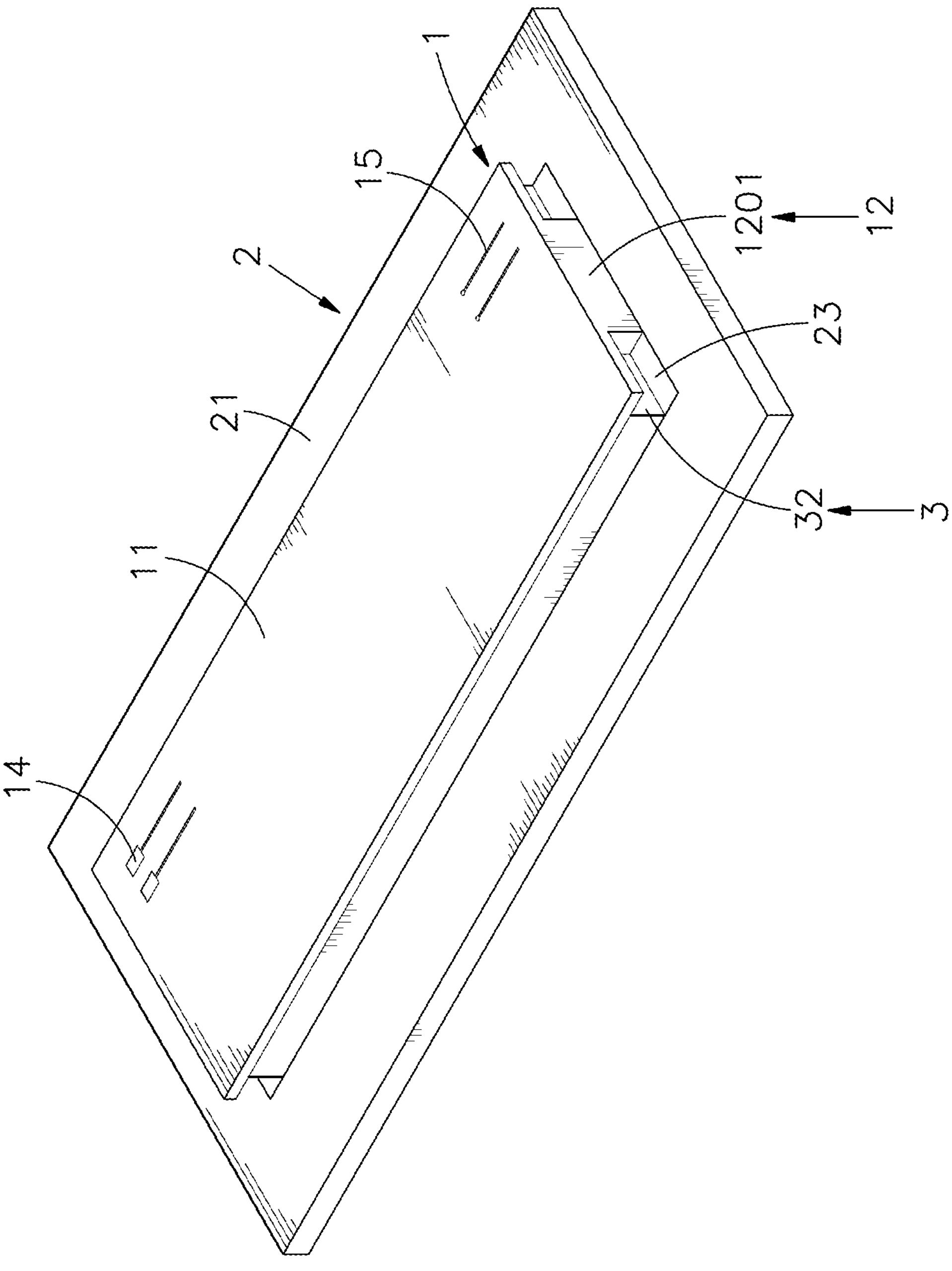
FIG. 8 is an oblique top elevational view of another alternate form of the magnetic device made in accordance with the present invention.
Figure 9:
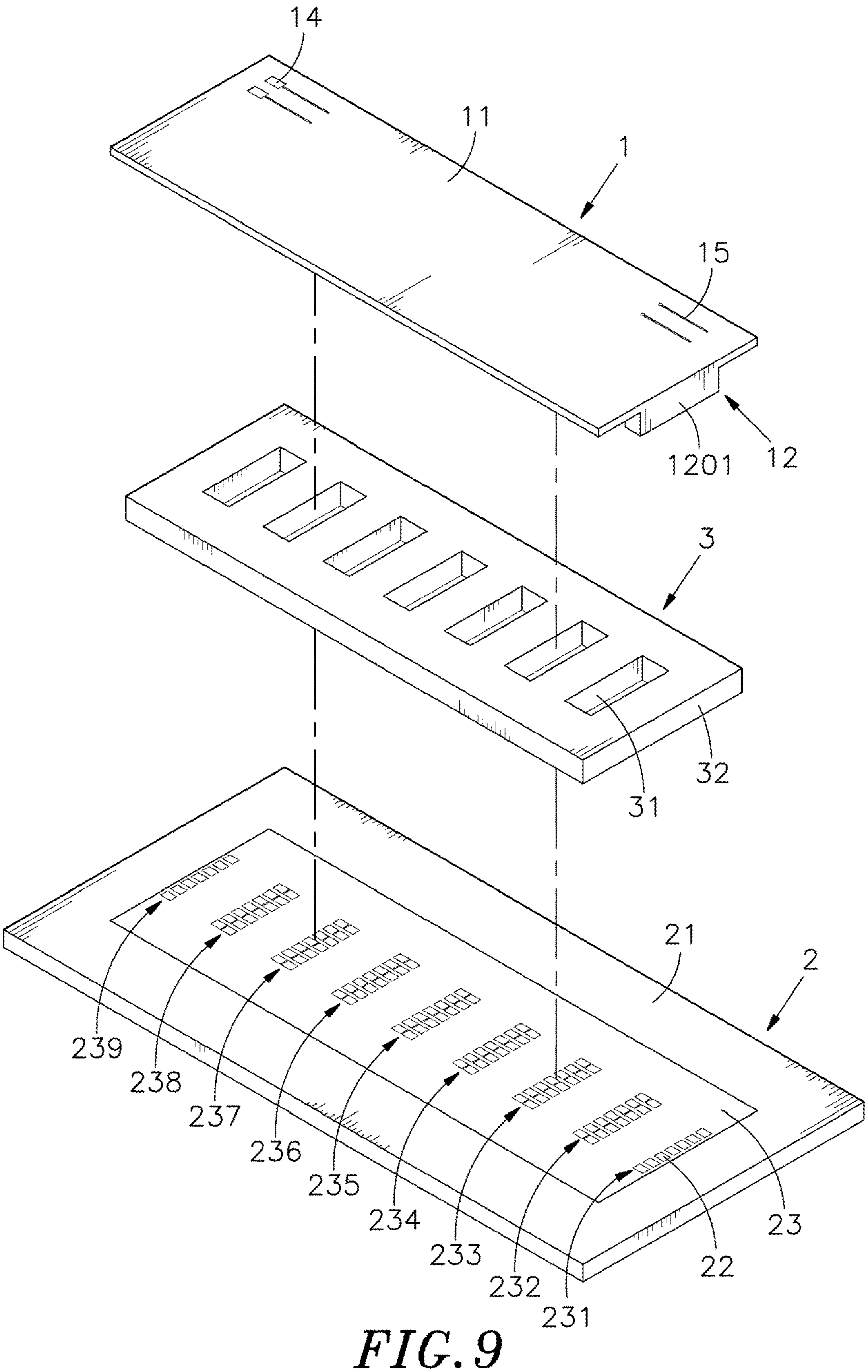
FIG. 9 is an exploded view of the magnetic device shown in FIG. 8.
Figure 10:
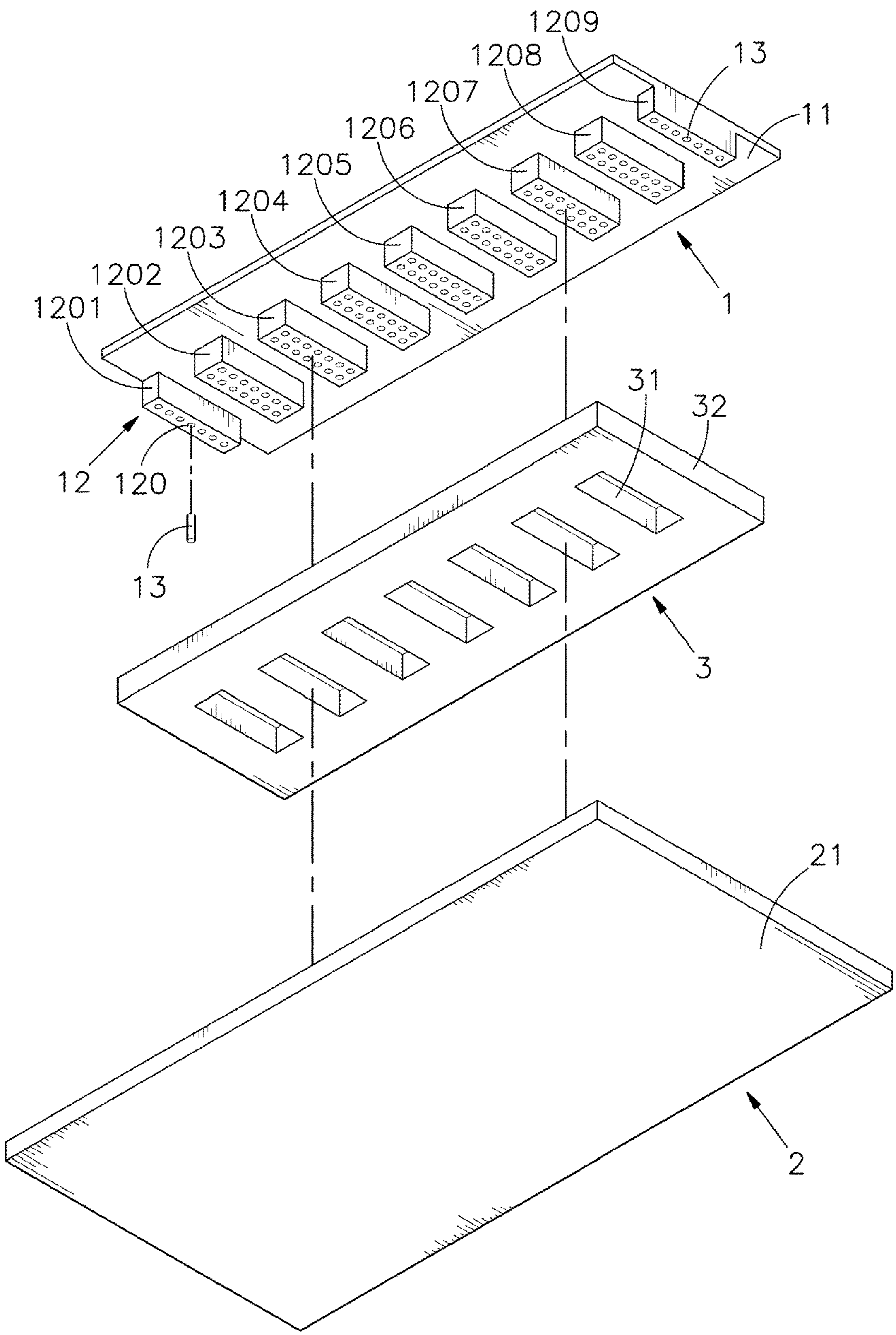
FIG. 10 corresponds to FIG. 8 when viewed from another angle.
Figure 11:
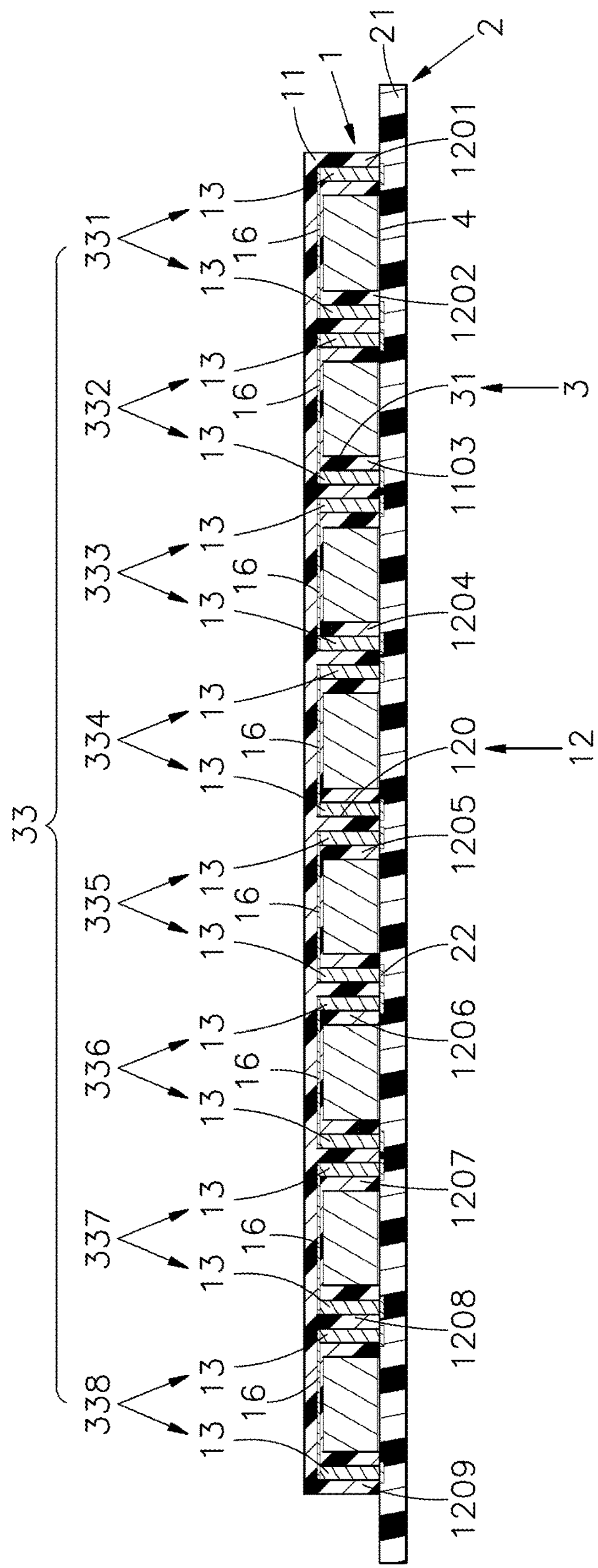
FIG. 11 is a sectional side view of the magnetic device shown in FIG. 8

Referring to FIGS. 1-11, a magnetic device fabrication method in accordance with the present invention is shown. As illustrated, the magnetic device fabrication method comprises the steps as follows:

(A) Use a mold to process an electrically insulative first substrate 1 into a first plate member 11 with a plurality of protruding blocks 12 at one side (the bottom side) thereof and a row of recessed holes 120 in each protruding block 12.

(B) Form a conductor 13 in each recessed hole 120 in each protruding block 12 of the first plate member 11.

(C) Use a mold to process an electrically insulative second substrate 2 into a second plate member 21.

(D) Form a plurality of conducting contact 22 in one side of the second plate member 21 of the second substrate 2, enabling the conducting contacts 22 to be arranged in rows.

(E) Use a mold to process a magnetic material into at least one magnetic core 3 each having at least one positioning slot 31 cut through opposing top and bottom surface thereof and two opposing positioning sidewalls 32 disposed at two opposite lateral sides relative to the at least one positioning slot 31.

(F) Attach the at least one magnetic core 3 to the first plate member 11 to couple the at least one positioning slot 31 of the at least one magnetic core 3 to the protruding blocks 12 of the first plate member 11 respectively, enabling two opposite protruding blocks 12 at two opposite lateral sides of the first plate member 11 to be respectively abutted against respective two opposing positioning sidewalls 32 that are disposed at two opposite lateral sides of the at least one magnetic core 3.

(G) Attach the second plate member 21 of the second substrate 2 to the at least one magnetic core 3 and the protruding blocks 12 of the first plate member 11, enabling the conducting contacts 22 in the second plate member 21 to be respectively kept in contact with the respective conductors 13 in the respective recessed holes 120 in the protruding blocks 12.

(H) Thus, the first substrate 1, the second substrate 2 and the at least one magnetic core 3 are joined to create a magnetic device.

The first substrate 1 and the second substrate 2 are selectively made of electrically insulative plastics, silicon rubber or ceramics in different shapes, and then respectively processed to provide a circuit layout using etching technology.

Further, the protruding blocks 12 at the first plate member 11 of the first substrate 1 are arranged in parallel and equally spaced from one another; the conductors 13 are respectively formed in the recessed holes 120 in the protruding blocks 12 by electroplating, welding, conducting adhesive filling, circuit printing or conductor press-fitting. Further, at least one input terminal 14 and at least one output terminal 15 are formed on an opposite side (the top side) of the first plate member 11 opposite to the protruding blocks 12. In one embodiment of the present invention, the first plate member 11 of the first substrate 1 is configured to provide 9 protruding blocks 1201~4209 numbered from first to ninth, namely, the first protruding block 1201, the second protruding block 1202, the third protruding block 1203, the fourth protruding block 1204, the fifth protruding block 1205, the sixth protruding block 1206, the seventh protruding block 1207, the eighth protruding block 1208 and the ninth protruding block 1209. The recessed holes are arranged in one row respectively in the first protruding block 1201 and the ninth protruding block 1209 disposed at two opposite lateral sides. The conductors 13 are respectively formed in the recessed holes 120 in the protruding blocks 12 by electroplating, welding, conducting adhesive filling, circuit printing or conductor press-fitting. The second protruding block 1202, the third protruding block 1203, the fourth protruding block 1204, the fifth protruding block 1205, the sixth protruding block 1206, the seventh protruding block 1207 and the eighth protruding block 1208 are equally spaced from one another between the first protruding block 1201 and the ninth protruding block 1209 in a parallel manner. After setting of the magnetic core 3 between the first substrate 1 and the second substrate 2, the first protruding block 1101 and ninth protruding block 1109 of the first substrate 101 are respectively abutted at the two opposite positioning sidewalls 32 of the at least one magnetic core 3, holding the magnetic core 3 positively in place. Further, the protruding blocks 1202~4208 from the second to the eighth are respectively configured to provide two rows of recessed holes 120 with respective conductors 13 formed therein by electroplating, welding, conducting adhesive filling, circuit printing or conductor press-fitting. The at least one magnetic core 3 is configured to provide 7 positioning slots 31 for receiving protruding blocks 1202~4208 from the second to the eighth respectively, enabling the first protruding block 1101 and ninth protruding block 1109 of the first substrate 101 to be respectively abutted at the two opposite positioning sidewalls 32 of the at least one magnetic core 3. Further, each magnetic core 3 is a rectangular member made of a magnetic material such as nickel zinc, manganese zinc, amorphous magnetic material or magnetic alloy material. Further, each magnetic core 3 has opposing top and bottom surfaces thereof respectively bonded to the first plate member 11 and the second plate member 21 using an adhesive 4. Thus, the fabrication of the magnetic device is quite simple, saving much fabrication time and labor. Further, the magnetic device thus made is small sized, suitable for use in a mobile electronic apparatus having light, thin, short and small characteristics. Further, the magnetic device can be configured for use as an inductor, transformer or other magnetic induction component.

Figure 12:
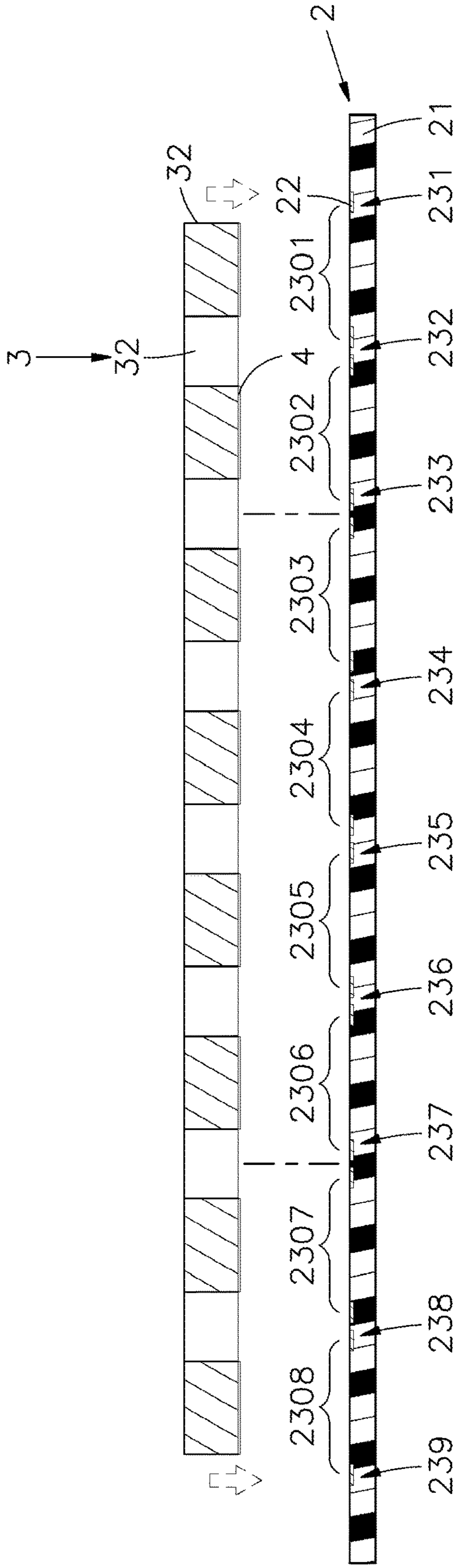
FIG. 12 is a schematic sectional side view illustrating the mounting procedure of the magnetic device shown in FIG. 8 (I).
Figure 13:
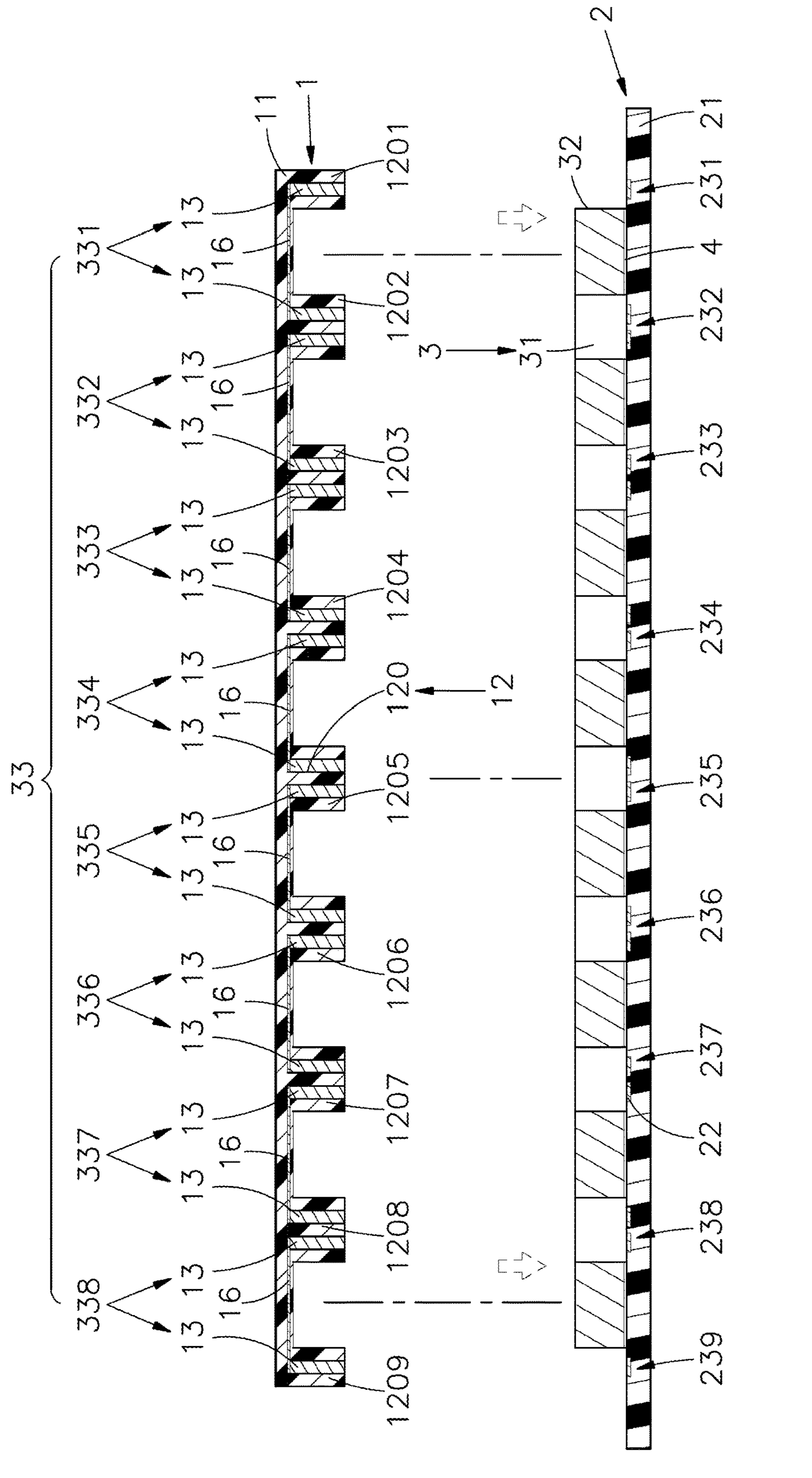
FIG. 13 is a schematic sectional side view illustrating the mounting procedure of the magnetic device shown in FIG. 8 (II).

Referring to FIGS. 9-13, the second plate member 21 of the second substrate 2 defines a position-limiting interval 23 for the positioning of the at least one magnetic core 3. The position-limiting interval 23 is divided into a plurality of mating connection portions, or as much as 9 mating connection portions, namely, the first mating connection portion 231, the second mating connection portion 232, the third mating connection portion 233, the fourth mating connection portion 234, the fifth mating connection portion 235, the sixth mating connection portion 236, the seventh mating connection portion 237, the eighth mating connection portion 238 and the ninth mating connection portion 239. One single row of conducting contacts 22 are arranged in each of the first mating connection portion 231 and the ninth mating connection portion 239. The second mating connection portion 232, the third mating connection portion 233, the fourth mating connection portion 234, the fifth mating connection portion 235, the sixth mating connection portion 236, the seventh mating connection portion 237 and the eighth mating connection portion 238 are properly arranged between the first mating connection portion 341 and the ninth mating connection portion 349 in a parallel manner, each having two rows of conducting contacts 22 arranged therein. The single row of conducting contacts 22 in the first mating connection portion 231 and one adjacent row of conducting contacts 22 in the adjacent second mating connection portion 232 constitute a first mating connection unit 2301; the other row of conducting contacts 22 in the second mating connection portion 232 and one adjacent row of conducting contacts 22 in the adjacent third mating connection portion 233 constitute a second mating connection unit 2302; the other row of conducting contacts 22 in the third mating connection portion 233 and one adjacent row of conducting contacts 22 in the adjacent fourth mating connection portion 234 constitute a third mating connection unit 2303; the other row of conducting contacts 22 in the fourth mating connection portion 234 and one row of conducting contacts 22 in the adjacent fifth mating connection portion 235 and one adjacent row of the adjacent conducting contacts 22 constitute a fourth mating connection unit 2304; the other row of conducting contacts 22 in the fifth mating connection portion 235 and one adjacent row of conducting contacts 22 in the sixth mating connection portion 236 constitute a fifth mating connection unit 2305; the other row of conducting contacts in the sixth mating connection portion 236 and one adjacent row of conducting contacts 22 in the adjacent seventh mating connection portion 237 constitute a sixth mating connection unit 2306; the other row of conducting contacts in the seventh mating connection portion 237 and one adjacent row of conducting contacts 22 in the adjacent eighth mating connection portion 238 constitute a seventh mating connection unit 2307; the other row of conducting contacts 22 in the eighth mating connection portion 238 and the single row of conducting contacts 22 in the adjacent ninth mating connection portion 239 constitute an eighth mating connection unit 2308.

The first plate member 11 of the first substrate 1 is also configured to provide a conducting layer 16. One single row of conductors 13 in the first protruding block 1201 is electrically conducted with one single row of conductors 13 in the adjacent second protruding block 1202 through the conducting layer 16 to create with the at least one magnetic core 3 and the first mating connection unit 2301 of the second plate member 21 a first induction area 331; the other row of conductors 13 in the second protruding block 1202 is electrically conducted with the one adjacent row of conductors 13 in the adjacent third protruding block 1203 through the conducting layer 16 to create with the at least one magnetic core 3 and the second mating connection unit 2302 of the second plate member 21 a second induction area 332; the other row of conductors 13 in the third protruding block 1203 is electrically conducted with one adjacent row of conductors 13 in the fourth protruding block 1204 through the conducting layer 16 to create with the at least one magnetic core 3 and the third mating connection unit 2303 of the second plate member 21 a third induction area 333; the other row of conductors 13 in the fourth protruding block 1204 is electrically conducted with one adjacent row of conductors 13 in the fifth protruding block 1205 through the conducting layer 16 to create with the at least one magnetic core 3 and the fourth mating connection unit 2304 of the second plate member 21 a fourth induction area 334; the other row of conductors 13 in the fifth protruding block 1205 is electrically conducted with one adjacent row of conductors 13 in the sixth protruding block 1206 through the conducting layer 16 to create with the at least one magnetic core 3 and the fifth mating connection unit 2305 of the second plate member 21 a fifth induction area 335; the other row of conductors 13 in the sixth protruding block 1206 is electrically conducted with the one adjacent row of conductors 13 in the seventh protruding block 1207 through the conducting layer 16 to create with the at least one magnetic core 3 and the sixth mating connection unit 2306 of the second plate member 21 a sixth induction area 336; the single row of conductors 13 in the seventh protruding block 1207 is electrically conducted with one adjacent row of conductors 13 in the eighth protruding block 1208 through the conducting layer 16 to create with the at least one magnetic core 3 and the seventh mating connection unit 2307 of the second plate member 21 a seventh induction area 337; the single row of conductors 13 in the eighth protruding block 1208 are electrically conducted with the single row of conductors 13 in the ninth protruding block 1209 through the conducting layer 16 to create with the at least one magnetic core 3 and the eighth mating connection unit 2308 of the second plate member 21 an eighth induction area 338. The induction areas 33 work with at least one magnetic core 3 to provide a continuous winding type induction coil effect.

Figure 14:
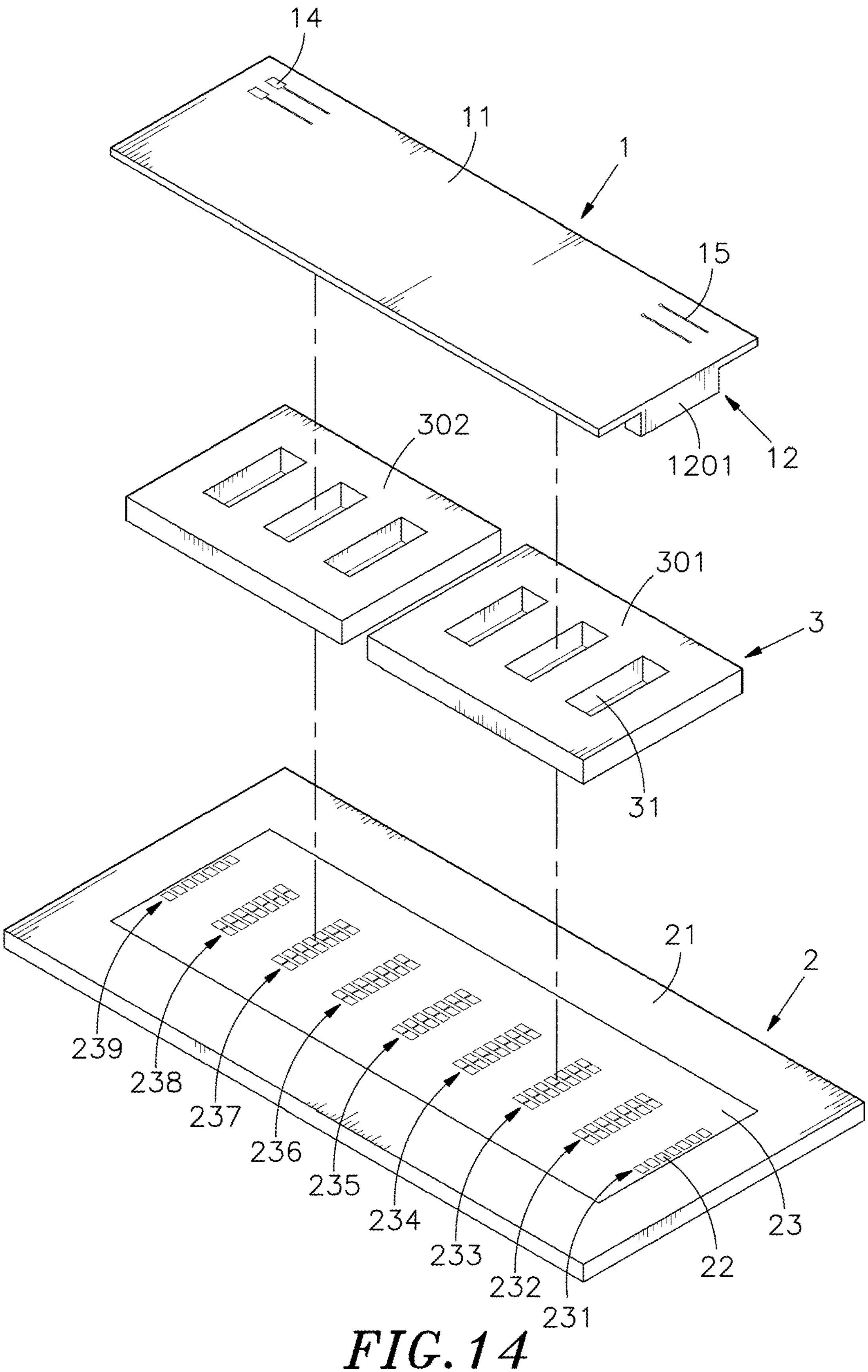
FIG. 14 is an exploded view of still another alternate form of the magnetic device made in accordance with the present invention.
Figure 15:
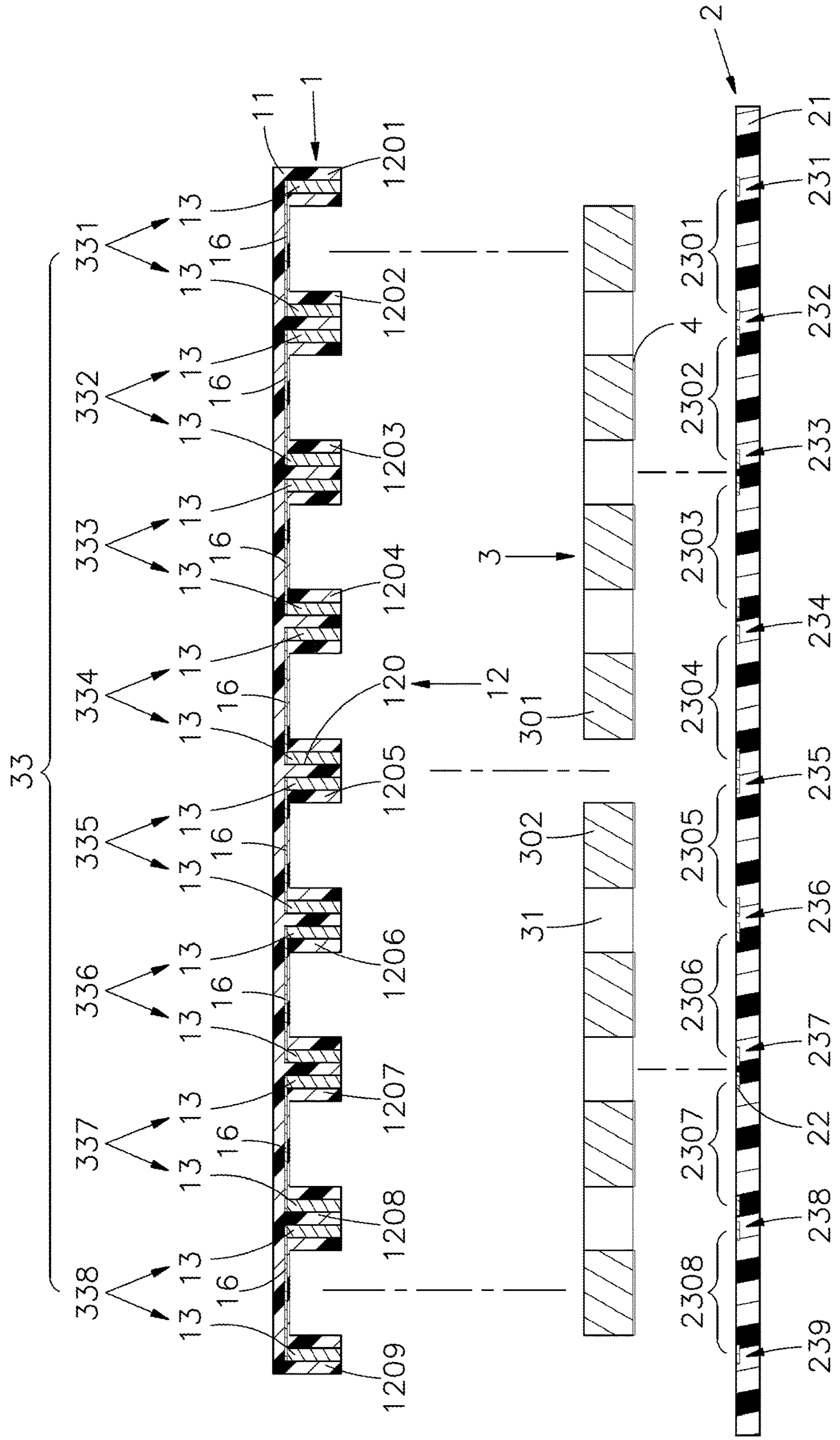
FIG. 15 is a sectional side view of FIG. 14.
Figure 16:
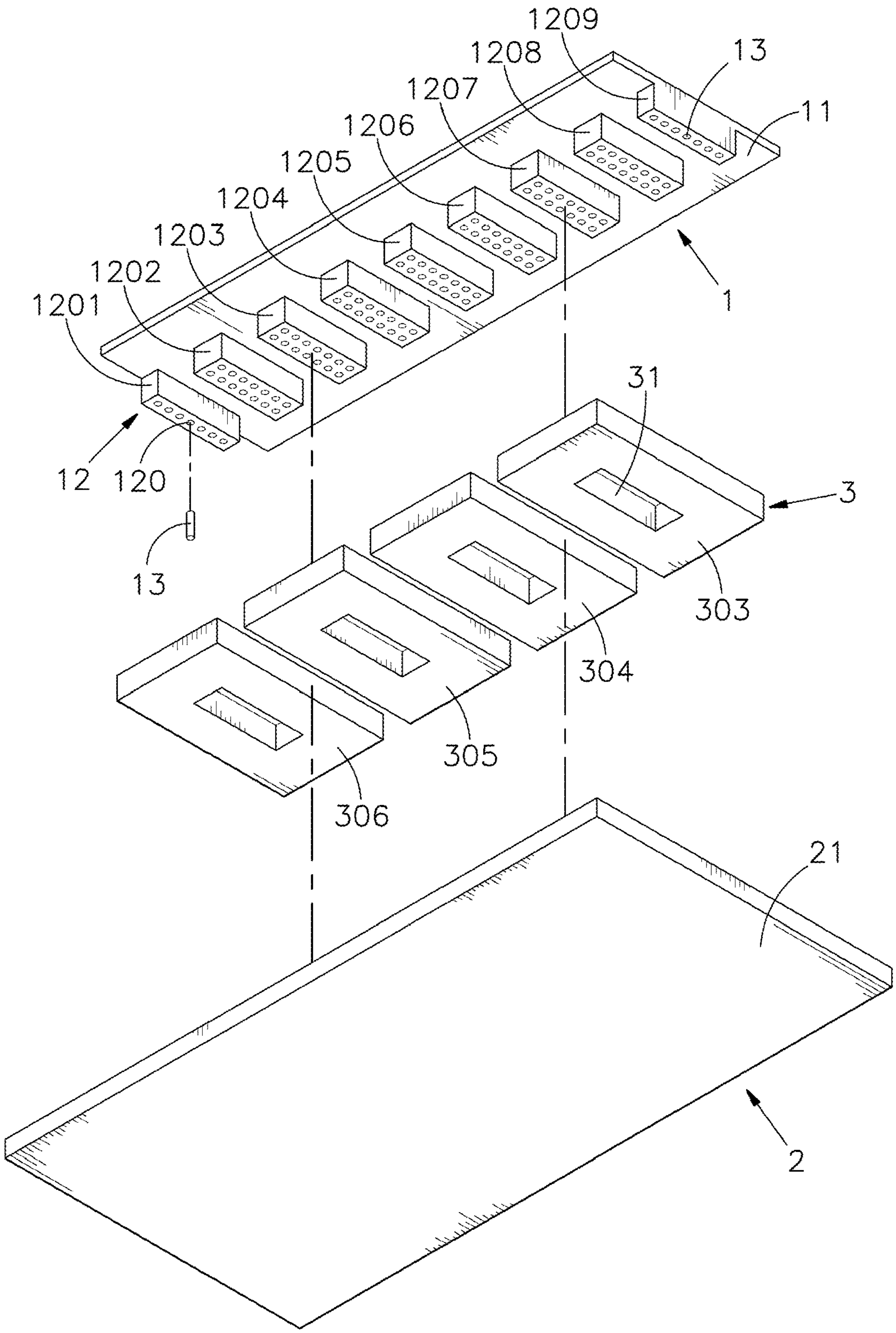
FIG. 16 is an exploded view of still another alternate form of the magnetic device made in accordance with the present invention.

Referring to FIGS. 4, 6, 9, 14, 15 and 16, one or multiple magnetic cores 3 can be mounted between the first plate member 11 of the first substrate 1 and the second plate member 21 of the second substrate 2. In the embodiment shown in FIGS. 13 and 14, a first magnetic core 301 and a second magnetic core 302 are arranged in parallel between the first plate member 11 of the first substrate 1 and the second plate member 21 of the second substrate 2. In the embodiment shown in FIG. 15, four magnetic cores, i.e., a third magnetic core 303, a fourth magnetic core 304, a fifth magnetic core 305 and a sixth magnetic core 306 are arranged in parallel between the first plate member 11 of the first substrate 1 and the second plate member 21 of the second substrate 2.

The arrangement of the first magnetic core 301 and the second magnetic core 302 between the first plate member 11 of the first substrate 1 and the second plate member 21 of the second substrate 2 to conduct with the conductors 13 in the first protruding block 1201, the second protruding block 1202, the third protruding block 1203, the fourth protruding block 1204, the fifth protruding block 1205, the sixth protruding block 1206, the seventh protruding block 1207, the eighth protruding block 1208 and the ninth protruding block 1209 through the conducting layer 16 and to mate with the first mating connection unit 2301, the second mating connection unit 2302, the third mating connection unit 2303, the fourth mating connection unit 2304, the fifth mating connection unit 2305, the sixth mating connection unit 2306, the seventh mating connection unit 2307 and the eighth mating connection unit 2308, creating the first induction area 331, the second induction area 332, the third induction area 333, the fourth induction area 334, the fifth induction area 335, the sixth induction area 336, the seventh induction area 33 and the eighth induction area 338 for providing a continuous winding type induction coil effect for rectifier or transformer application.

As described above, the third magnetic core 303, the fourth magnetic core 304, the fifth magnetic core 305 and the sixth magnetic core 306 can be arranged in parallel between the first plate member 11 of the first substrate 1 and the second plate member 21 of the second substrate 2 to contact with the conductors 13 in the protruding blocks 12 of the first plate member 11, the conducting layer 16 and the conducting contacts 22 of the second plate member 21 and to further create multiple induction areas 33 for providing a continuous winding type induction coil effect, wherein the first and ninth protruding blocks 1201,1209 of the first plate member 11 are respectively electrically plated to provide one single row of conductors 13; the other protruding blocks 1202~1208 of the first plate member 11 are respectively electrically plated to provide two rows of conductors 13. Thus, the magnetic device can provide a continuous winding type induction coil effect for rectifier or transformer application.

Figure 17:
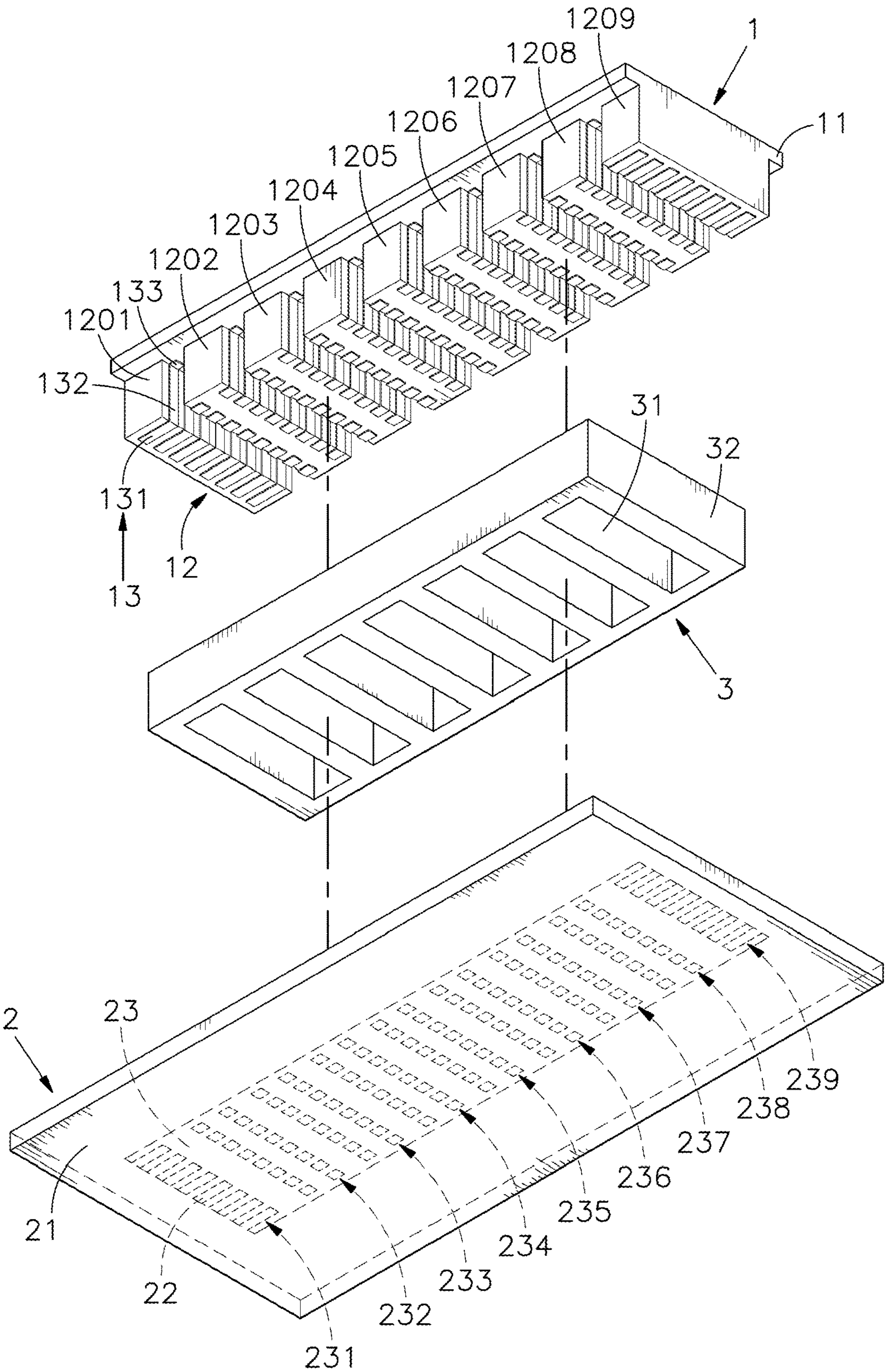
FIG. 17 is an exploded view of still another alternate form of the magnetic device made in accordance with the present invention.
Figure 18:
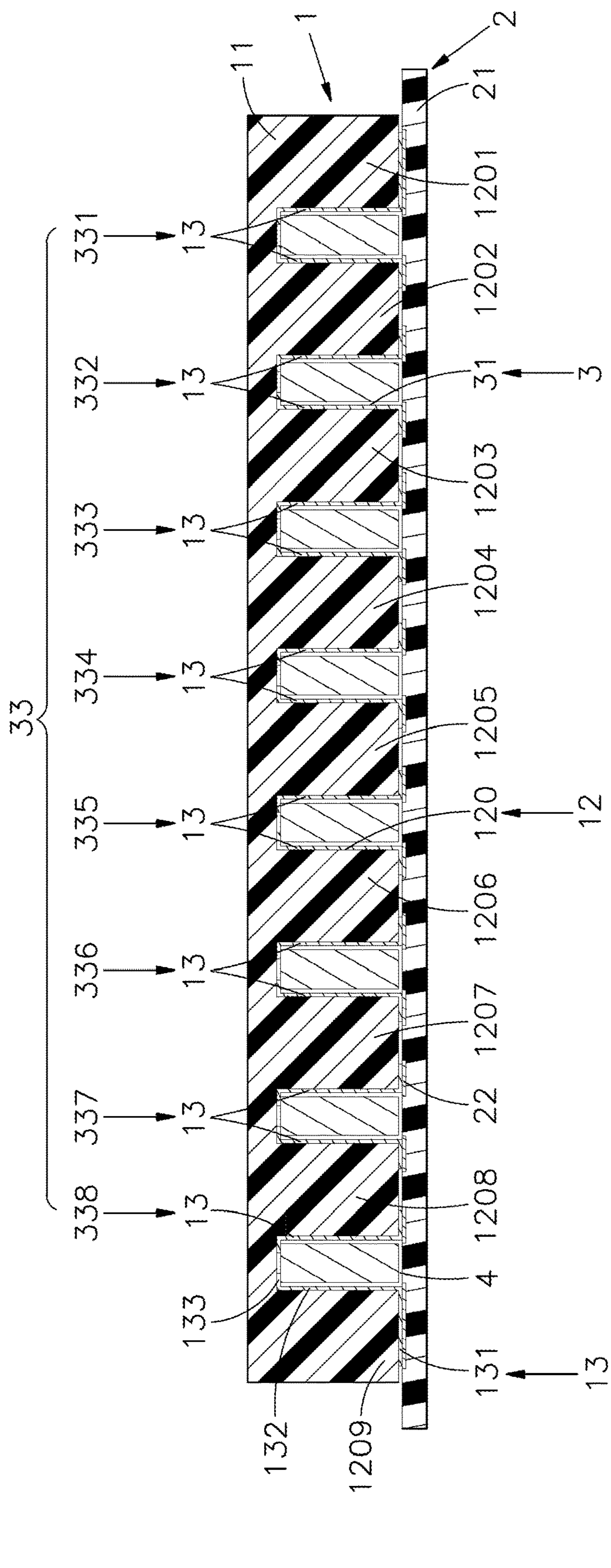
FIG. 18 is a sectional side view of the magnetic device shown in FIG. 17.

Referring to FIGS. 4, 6, 9, 17 and 18, the first and ninth protruding blocks 1201,1209 of the first plate member 11 of the first substrate 1 are respectively electrically plated to provide one single row of conductors 13; the second to eighth protruding blocks 1202~1208 are respectively electrically plated to provide two rows of conductors 13; the conductors 13 in the first to ninth protruding blocks 1201~1209 each comprise a first conducting segment 131 disposed at an outer side for direct contact with one respective conducting contact 22, a third conducting segment 133 disposed at an inner side, and a second conducting segment 132 connected between the first conducting segment 131 and the third conducting segment 133. The adhesive 4 is applied to the opposing top and bottom surfaces of each magnetic core 3 and the internal wall surface of each positioning slot 31 so that the magnetic core 3 is electrically isolated from the first and second conducting segments 131,132 of the conductors 13 of the protruding blocks 1201~4209, however, each magnetic core 3 is electrically connected with the two third conducting segments 133 of adjacent conductors 13 and the first conducting segments 131 of the conductors 13 are respectively disposed in contact with the respective conducting contacts 22 of the second substrate 2, and therefore, the conductors 13 are electrically connected with the respective conducting contacts 22 to create with the at least one magnetic core 3 a plurality of induction areas 33, for example, first induction area 331, second induction area 332 third induction area 333, fourth induction area 334, fifth induction area 335, sixth induction area 336, seventh induction area 337 and eighth induction area 338 for providing a continuous winding type induction coil effect for rectifier or transformer application.

What the invention claimed is:

1. A magnetic device fabrication method, comprising the steps of:

(A) using a mold to process an electrically insulative first substrate into a first plate member with a plurality of protruding blocks;

(B) forming a plurality of conductors in each of said protruding block of said first plate member;

(C) using a mold to process an electrically insulative second substrate into a second plate member;

(D) forming a plurality of conducting contact in one side of said second plate member of said second substrate, enabling said conducting contacts to be arranged in rows;

(E) using a mold to process a magnetic material into at least one magnetic core each having at least one positioning slot cut through opposing top and bottom surface thereof and two opposing positioning sidewalls disposed at two opposite lateral sides relative to said at least one positioning slot;

(F) attaching said at least one magnetic core to said first plate member to couple said at least one positioning slot of said at least one magnetic core to said protruding blocks of said first plate member respectively, enabling two opposite said protruding blocks at two opposite lateral sides of said first plate member to be respectively abutted against respective two opposing said positioning sidewalls that are disposed at two opposite lateral sides of said at least one magnetic core;

(G) attaching said second plate member of said second substrate to said at least one magnetic core and said protruding blocks of said first plate member, enabling said conducting contacts in said second plate member to be respectively kept in contact with the respective said conductors in the respective said protruding blocks; and (H) obtaining a finished magnetic device.

2. The magnetic device fabrication method as claimed in claim 1, wherein said first substrate prepared in step (A) and said second substrate prepared in step (C) are one-piece members selected from group consisting of electrically insulative plastics, silicon rubber and ceramics.

3. The magnetic device fabrication method as claimed in claim 1, wherein in steps (A) and (B), said first plate member of said first substrate are processed to provide a plurality of protruding blocks numbered from first to ninth, one row of recessed holes in each of said first protruding block and said ninth protruding block and two rows of said recessed holes in each of said second protruding block, said third protruding block, said fourth protruding block, said fifth protruding block, said sixth protruding block, said seventh protruding block and said eighth protruding block, and one of said conductors is formed in each said recessed hole of the said protruding blocks numbered from the first to the ninth; in step (E), said at least one magnetic core is processed to provide 7 positioning slots; in step (C) said second plate member of said second substrate defines a position-limiting interval that is divided into a first mating connection portion, a second mating connection portion, a third mating connection portion, a fourth mating connection portion, a fifth mating connection portion, a sixth mating connection portion, a seventh mating connection portion, an eighth mating connection portion and a ninth mating connection portion; one single row of said conducting contacts is arranged in each of said first mating connection portion and said ninth mating connection portion; said second mating connection portion, said third mating connection portion, said fourth mating connection portion, said fifth mating connection portion, said sixth mating connection portion, said seventh mating connection portion and said eighth mating connection portion being arranged between said first mating connection portion and said ninth mating connection portion in a parallel manner with two rows of said conducting contacts respectively arranged therein, the single row of said conducting contacts in said first mating connection portion and one adjacent row of said conducting contacts in the adjacent said second mating connection portion constituting a first mating connection unit, the other row of said conducting contacts in said second mating connection portion and one adjacent row of said conducting contacts in the adjacent said third mating connection portion constituting a second mating connection unit, the other row of said conducting contacts in said third mating connection portion and adjacent one row of said conducting contacts in the adjacent said fourth mating connection portion constituting a third mating connection unit, the other row of said conducting contacts in said fourth mating connection portion and adjacent one row of said conducting contacts in the adjacent said fifth mating connection portion and one adjacent row of the adjacent said conducting contacts constituting a fourth mating connection unit, the other row of said conducting contacts in said fifth mating connection portion and one adjacent row of said conducting contacts in said sixth mating connection portion constituting a fifth mating connection unit, the other row of said conducting contacts in said sixth mating connection portion and one adjacent row of said conducting contacts in the adjacent said seventh mating connection portion constitute a sixth mating connection unit, the other row of said conducting contacts in said seventh mating connection portion and one adjacent row of said conducting contact in the adjacent said eighth mating connection portion constituting a seventh mating connection unit, the other row of said conducting contacts in said eighth mating connection portion and the single row of said conducting contacts in the adjacent said ninth mating connection portion constituting an eighth mating connection unit.

4. The magnetic device fabrication method as claimed in claim 3, wherein said first plate member of said first substrate is configured to provide a conducting layer, one single row of said conductors in said first protruding block being electrically conducted with one single row of said conductors in the adjacent said second protruding block through said conducting layer to create with the at least one said magnetic core and said first mating connection unit of said second plate member a first induction area, the other row of said conductors in said second protruding block being electrically conducted with one adjacent row of said conductors in said third protruding block through said conducting layer to create with said at least one magnetic core and said second mating connection unit of said second plate member a second induction area, the other row of said conductors in said third protruding block being electrically conducted with one adjacent row of said conductors in said fourth protruding block through said conducting layer to create with said at least one magnetic core and said third mating connection unit of said second plate member a third induction area, the other row of said conductors in said fourth protruding block being electrically conducted with one adjacent row of said conductors in said fifth protruding block through said conducting layer to create with said at least one magnetic core and said fourth mating connection unit of said second plate member a fourth induction area, the other row of said conductors in said fifth protruding block being electrically conducted with one adjacent row of said conductors in said sixth protruding block through said conducting layer to create with said at least one magnetic core and said fifth mating connection unit of said second plate member a fifth induction area, the other row of said conductors in said sixth protruding block being electrically conducted with one adjacent row of said conductors in said seventh protruding block through said conducting layer to create with said at least one magnetic core and said sixth mating connection unit of said second plate member a sixth induction area, the other row of said conductors in said seventh protruding block being electrically conducted with one adjacent row of said conductors in said eighth protruding block through said conducting layer to create with said at least one magnetic core and said seventh mating connection unit of said second plate member a seventh induction area, the other row of said conductors in said eighth protruding block being electrically conducted with the single row of said conductors in said ninth protruding block through said conducting layer to create with said at least one magnetic core and said eighth mating connection unit of said second plate member an eighth induction area, said first induction area, said second induction area, said third induction area, said fourth induction area, said fifth induction area, said sixth induction area, said seventh induction area and said eighth induction area working with said at least one magnetic core to provide a continuous winding type induction coil effect.

5. The magnetic device fabrication method as claimed in claim 1, wherein said conductors are formed in said recessed holes in said protruding blocks of said first substrate in step (B) by welding, electroplating, conducting adhesive filling, circuit printing or conductor press-fitting, and at least one input terminal and at least one output terminal are formed at the same time on an opposite side of said first plate member opposite to said protruding blocks in step (B).

6. The magnetic device fabrication method as claimed in claim 1, wherein in step (B) said conductors are formed on an outer surface, opposite inner sides and a bottom side of said first plate member of said first substrate by electroplating.

7. The magnetic device fabrication method as claimed in claim 1, wherein in step (E), each said magnetic core is a rectangular member with the opposing top and bottom surfaces thereof respectively covered with an adhesive for bonding to said first substrate and said second substrate; said magnetic material is selected from the group of nickel zinc, manganese zinc, amorphous magnetic materials and magnetic alloy materials.

* * * * *